United States Patent
Sisodia et al.

(10) Patent No.: US 11,322,197 B1
(45) Date of Patent: May 3, 2022

(54) POWER-GATING TECHNIQUES WITH BURIED METAL

(71) Applicant: Arm Limited, Cambridge (GB)

(72) Inventors: Rajiv Kumar Sisodia, Bangalore (IN); Andy Wangkun Chen, Austin, TX (US); Ayush Kulshrestha, New Delhi (IN); Sony, Noida (IN); Sriram Thyagarajan, Austin, TX (US); Yew Keong Chong, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/076,540

(22) Filed: Oct. 21, 2020

(51) Int. Cl.
    G11C 5/14 (2006.01)
    G11C 11/418 (2006.01)

(52) U.S. Cl.
    CPC .............. G11C 11/418 (2013.01); G11C 5/14 (2013.01)

(58) Field of Classification Search
    CPC .................................. G11C 11/418; G11C 5/14
    See application file for complete search history.

(56) References Cited

U.S. PATENT DOCUMENTS

| | | | | |
|---|---|---|---|---|
| 10,685,865 | B2* | 6/2020 | Sung | H01L 21/823431 |
| 2007/0002673 | A1* | 1/2007 | Miller | G11C 11/413 365/230.06 |
| 2008/0205184 | A1* | 8/2008 | Tsu | G11C 11/413 365/226 |
| 2011/0007590 | A1* | 1/2011 | Katayama | G11C 8/08 365/203 |
| 2014/0307500 | A1* | 10/2014 | Su | G11C 11/419 365/154 |
| 2015/0380065 | A1* | 12/2015 | Adams | G11C 5/148 365/226 |
| 2016/0379694 | A1* | 12/2016 | Kulkarni | G11C 11/419 365/189.09 |
| 2020/0075489 | A1* | 3/2020 | Liebmann | H01L 27/1104 |
| 2020/0135718 | A1* | 4/2020 | Liebmann | H01L 21/823871 |

* cited by examiner

*Primary Examiner* — Khamdan N. Alrobaie
(74) *Attorney, Agent, or Firm* — Pramudji Law Group PLLC; Ari Pramudji (57) ABSTRACT

Various implementations described herein are related to a device having wordline drivers coupled to a core array. The device may have backside power network with buried power rails. The device may have header logic coupled to power supply connections of the wordline drivers by way of the buried power rails, and the header logic may be used to power-gate the wordline drivers.

20 Claims, 4 Drawing Sheets

POWER-GATING TECHNIQUES WITH BURIED METAL

BACKGROUND

This section is intended to provide information relevant to understanding the various technologies described herein. As the section's title implies, this is a discussion of related art that should in no way imply that it is prior art. Generally, the related art may or may not be considered prior art. It should therefore be understood that any statement in this section should be read in this light, and not as any admission of prior art.

In some memory architecture designs, conventional power rails can be buried in memory, wherein metal power lines can be buried in the substrate, and these lines can be used as power rails for voltage distribution from backside circuitry. However, in these conventional memory designs, memory cells typically use frontside power rails for voltage distribution to frontside circuitry including the memory cells. Unfortunately, conventional memory designs are inefficient in that use of frontside power rails for memory cells suffers from area penalty in fabrication. Therefore, there exists a need to improve conventional memory designs to improve area efficiency of modern memory architecture.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to memory architecture having a power distribution network (PDN) with buried power supply rails in physical layout design. The various schemes and techniques described herein provide for a distributed wordline driver power-gating technique that uses buried metal in memory applications. In various implementations, clock-to-wordline delay plays a critical role in defining memory performance, and since wordline drivers typically consume a large amount of power, the various schemes and techniques described herein provide a power-gated supply to the wordline drivers with header logic that may be activated and deactivated to thereby reduce leakage. The novel header architecture described herein utilizes backside buried metal, and the header is distributed along with the wordline driver so as to reduce area impact and also to improve the timing and performance of memory.

In some implementations, the various backside power distribution schemes and techniques described herein may provide for random access memory (RAM) applications including static RAM (SRAM). Therefore, various implementations described herein may provide for a novel cell architecture that utilizes buried metal for critical signals in SRAM applications. In reference to backside power domains for SRAM technology, metallization may be provided frontside (e.g., above a device) and also backside (e.g., below a device) as buried power rails. In the logic domain, the buried power rails may be used to supply power to memory components in a core array such that power domains are used to avoid area penalty. Various implementations described herein may also provide for an overall power domain scheme for memory applications, including, e.g., various use of backside-to-frontside transition cells having transition vias. These aspects along with various other features and characteristics are described in greater detail herein.

Various implementations of memory architecture with a novel power distribution network (PDN) along with various power distribution schemes and techniques associated therewith will be described in greater detail herein with reference to FIGS. 1-4.

Figure 1:
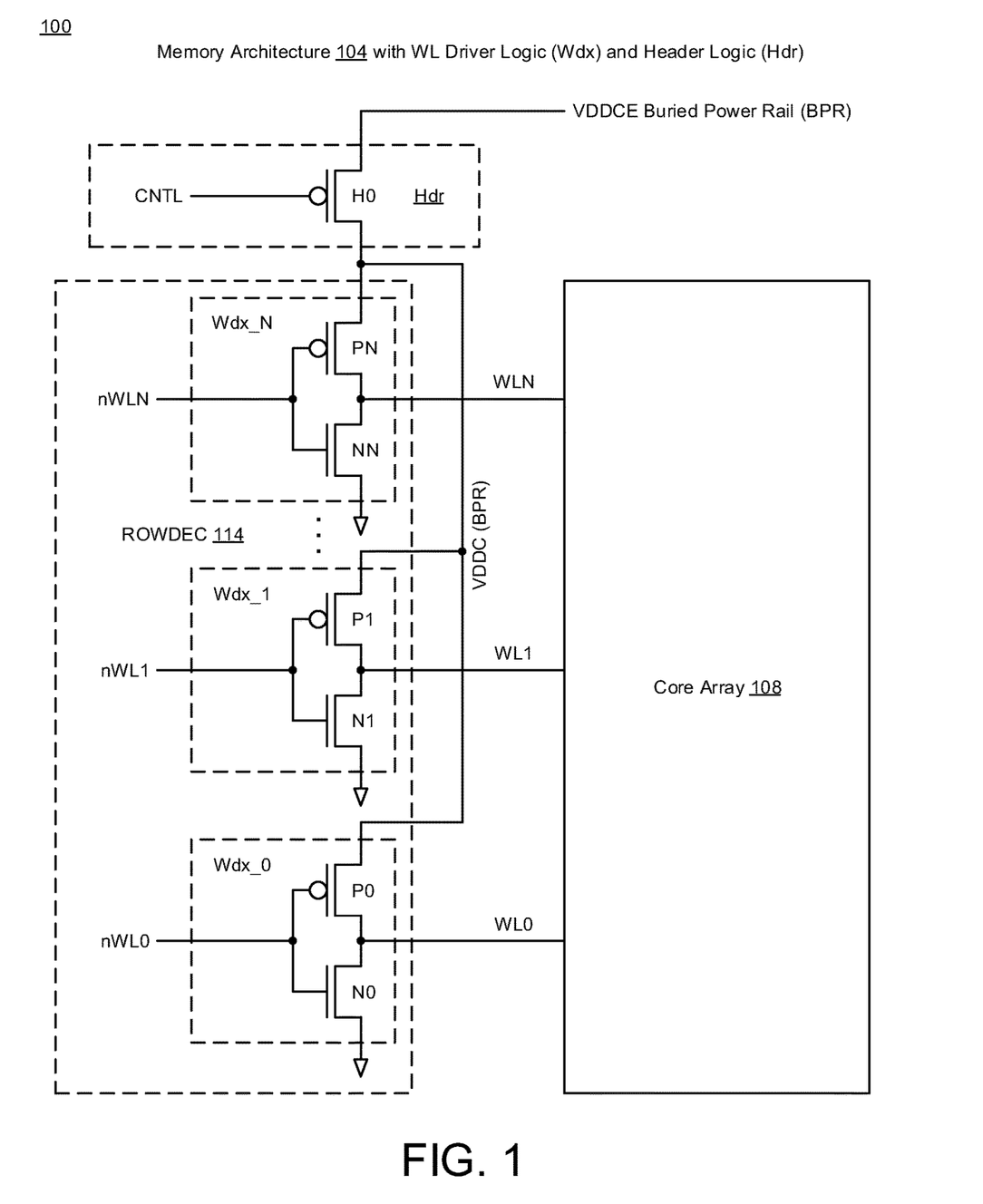
FIG. 1 illustrates a diagram of wordline driver and header architecture utilizing buried power rails in accordance with various implementations described herein.

FIG. 1 illustrates a diagram of memory architecture 104 with wordline driver logic (Wdx) and header logic (Hdr) that utilize buried power rails (BPR) in accordance with various implementations described herein. The memory architecture 104 may include a power distribution network (PDN) with frontside (FS) power rails and backside (BS) buried power rails along with transition cells having vias that provide for inter-layer transitioning between frontside (FS) and/or backside (BS) metal layers. In some implementations, the memory architecture 104 may be arranged and configured for power-gating the wordline driver logic (Wdx) with the header logic (Hdr) using the buried power rails (BPR), which may be referred to as buried power supply rails.

In various implementations, the memory architecture 104 may be implemented as a system or a device having integrated circuit (IC) components that are arranged and coupled together as an assemblage or combination of parts that provide for physical circuit designs and related structures. In some instances, a method of designing, providing and building the memory architecture 104 as an integrated system or device may involve use of various IC circuit components described herein so as to implement the backside power distribution schemes and techniques associated therewith. The memory architecture 104 may be integrated with computing circuitry and related components on a single chip, and the memory architecture 104 may also be implemented in some embedded systems for automotive, electronic, mobile, server and Internet-of-things (IoT) applications.

As shown in FIG. 1, the memory architecture 104 may have memory with one or more core memory arrays 108 having multiple bitcells (BC). The memory architecture 104 may include logic circuitry disposed frontside (FS) with buried power rails (BPR) that are formed with backside (BS) metal layers that supply core voltage (e.g., VDDC, VDDCE) to the memory core array 108. The buried power rails (BPR) may include a first path (or branch) that is routed to the header logic (Hdr). Also, the buried power rails (BPR) may include a second path (or branch) that is routed between the header logic (Hdr) and the wordline driver logic (Wdx). In some implementations, the first path provides a first core voltage (VDDCE) to a power supply connection of the header logic (Hdr), and the second path provides a second core voltage (VDDC) between the header logic (Hdr) and a power supply connection of the wordline driver logic (Wdx). Also, in some implementations, the first core voltage (VDDCE) refers to an external core voltage (VDDCE), and the second core voltage (VDDC) refers to an internal core voltage (VDDC). In various instances, the header logic (Hdr) may be implemented with a P-type MOS (PMOS) transistor; however, various other devices and/or configurations may be used.

The wordline driver logic (Wdx) may include row decoder logic 114 (ROWDEC) having a number (N) of wordline drivers (Wdx_0, Wdx_1, ..., Wdx_N) that are coupled to the core array 108 via a number of wordlines (WL0, WL1, ..., WLN). In some instances, each of the wordline drivers (Wdx_0, Wdx_1, ..., Wdx_N) may be configured to receive a corresponding wordline signal (nWL0, nWL1, ..., nWLN) and provide a corresponding buffered wordline driver signal (WL0, WL1, ..., WLN) to the core array 108. Also, each of the wordline drivers (Wdx_0, Wdx_1, ..., Wdx_N) may be implemented as buffers (or inverters) having transistor logic (e.g., N0/P0, N1/P1, ..., NN/PN). For instance, as shown in FIG. 1, a first wordline driver (Wdx_0) may have transistors (N0, P0) that are arranged as a first inverter, a second wordline driver (Wdx_1) may have transistors (N1, P1) that are arranged as a second inverter, and also, a last wordline driver (Wdx_N) may have transistors (NN PN) that are arranged as a last inverter. In some instances, the transistors (N1, P1) may be implemented with an N-type MOS (NMOS) transistor and a P-type MOS (PMOS) transistor; however, various other configurations may be used.

The memory architecture 104 may have a backside power network (BSPN) with the buried power rails (BPR) that provide the core voltages (VDDCE, VDDC). The header logic (Hdr) may be coupled to power supply connections of the wordline drivers (Wdx_0, Wdx_1, ..., Wdx_N) by way of the buried power rails (BPR). In some implementations, the header logic (Hdr) may be used to power-gate the wordline drivers (Wdx_0, Wdx_1, ..., Wdx_N). The wordline drivers (Wdx_0, Wdx_1, ..., Wdx_N) may have inverter logic that is activated with a first wordline signal (nWL0, nWL1, ..., nWLN), and the wordline drivers (Wdx_0, Wdx_1, ..., Wdx_N) may provide a second wordline signal wordline driver signal (WL0, WL1, ..., WLN) to the core array 108 when activated.

In some implementations, the buried power rails (BPR) may provide a first net (VDDCE) that provides a first core voltage (VDDCE) to the header logic (Hdr), and also, the first core voltage (VDDCE) may refer to an external core voltage (VDDCE). Moreover, in some implementations, the buried power rails (BPR) may provide a second net (VDDC) that provides a second core voltage (VDDC) from the header logic (Hdr) to the wordline drivers (Wdx_0, Wdx_1, ..., Wdx_N), and the second core voltage (VDDC) may refer to an internal core voltage (VDDC). As shown in FIG. 1, the header logic (Hdr) may have a transistor (H0) coupled between the first net (VDDCE) and the second net (VDDC), and the transistor (H0) may be used to power-gate logic in the row decoder 114 (ROWDEC), such as, e.g., the wordline drivers (Wdx_0, Wdx_1, ..., Wdx_N). Also, the transistor (H0) may receive the first core voltage (VDDCE) from the first net (VDDCE), and the transistor (H) may provide the second core voltage (VDDC) to the wordline drivers (Wdx_0, Wdx_1, ..., Wdx_N) when activated by a control signal (CNTL).

In some implementations, the backside power network (BSPN) may use buried backside metal layers to form the buried power rails (BPR). Also, in some instances, the buried backside metal layers may be used to provide the external core voltage (VDDCE) to the header logic (Hdr). Moreover, in some instances, the buried backside metal layers may be used to provide the internal core voltage (VDDC) between the header logic (Hdr) and the wordline drivers (Wdx_0, Wdx_1, ..., Wdx_N).

In various implementations, the schemes and techniques described herein may improve access time and cycle time. For instance, routing in the buried backside metal layers may be used to provide flexibility for power-gating the wordline drivers (Wdx_0, Wdx_1, ..., Wdx_N), and in some instances, based on resistance and capacitance of different backside metal layers, various backside metal layers (e.g., BM0, BM1, etc.) may be used.

In some implementations, the memory architecture 104 may include a frontside power network (FSPN) having the frontside (FS) power rails coupled to various memory components and/or logic circuits. In some instances, the frontside power supply rails may be coupled to logic circuitry associated with the bitcell array 108 arranged in columns and rows along with header logic (Hdr) and control logic (Wdx). The frontside power network (FSPN) may include a number (N) of frontside metal layers (e.g., FS/M0, FS/M2).

In some implementations, the memory architecture 104 may include a backside power network (BSPN) having the backside (BS) power rails coupled to various memory components and/or logic circuits. In some instances, the backside power supply rails may be coupled to logic circuitry associated with bitcell array 108 arranged in columns and rows along with header logic (Hdr) and control logic (Wdx). The backside power network (BSPN) may include a number (N) of backside metal layers (e.g., BS/BM0, BS/BM1).

In some configurations, the memory architecture 104 may be implemented with a novel cell architecture that may provide backside metal for power distribution in various memory applications, such as, e.g., random access memory (RAM) including static RAM (SRAM). For instance, the novel cell architecture may be configured to provide backside (BS) power distribution for memory circuitry (e.g., SRAM), wherein metallization may be provided frontside above the memory circuitry and backside below the memory circuitry as buried power rails (BPR). The novel cell architecture may also use buried metallization for backside-to-frontside transition cells that allows for backside distribution of power and critical signal nets to memory circuitry that is disposed frontside. The backside power rails (BPR) for memory applications may be buried in the substrate and/or in oxide layers, and these buried metal lines may be utilized as power rails for distributing power and/or signal lines for transmitting critical signals. These aspects and various other features, behaviors and characteristics are described herein in reference to FIGS. 2-4.

Figure 2:
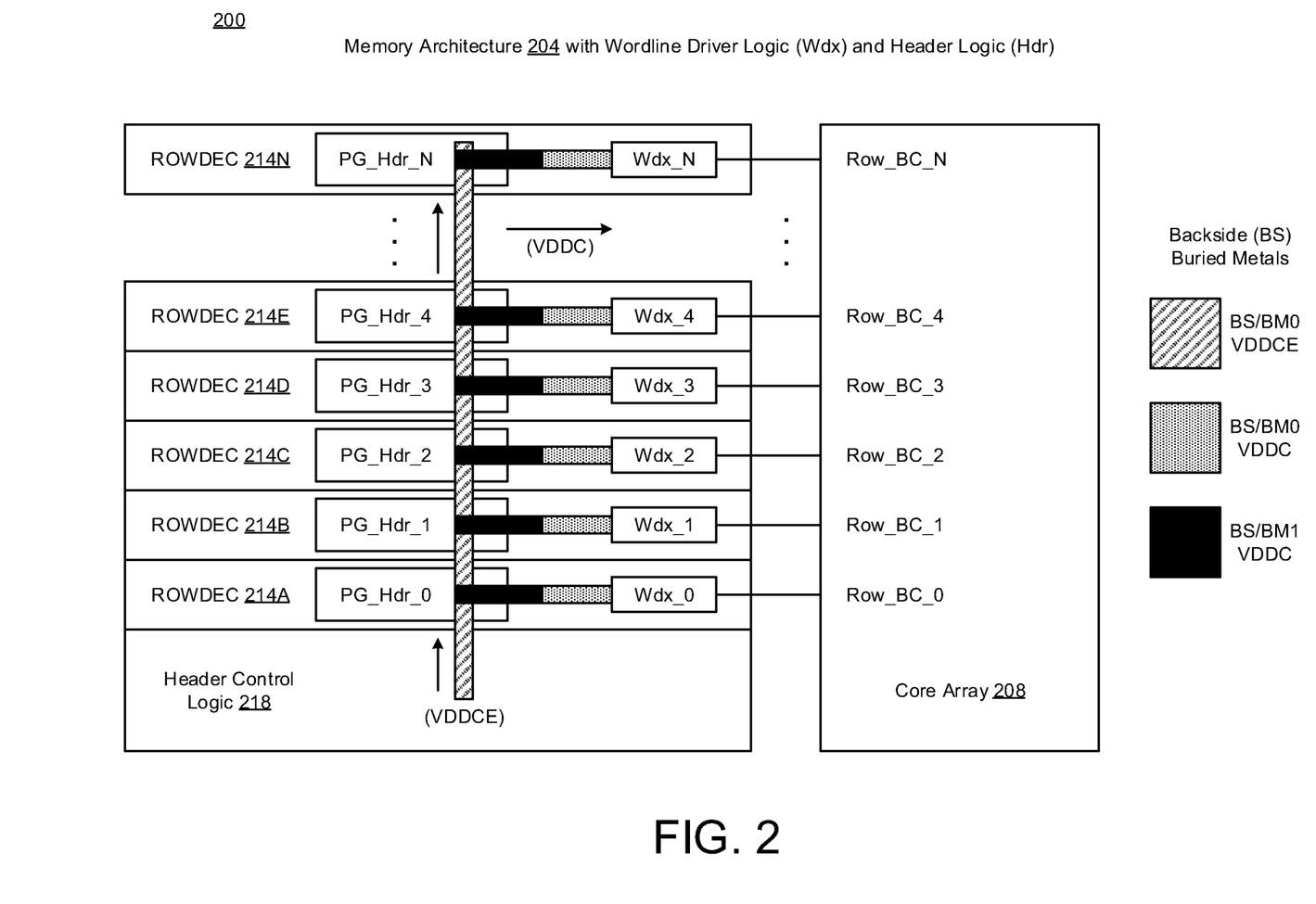
FIGS. 2-3 illustrate other diagrams of wordline driver and header architecture utilizing buried power rails in accordance with implementations described herein.

FIG. 2 illustrate a diagram of memory architecture 204 having wordline driver logic (Wdx) and header logic (Hdr) that utilize buried power rails (BPR) in accordance with various implementations described herein. In some implementations, FIG. 2 provides a configuration diagram 200 of memory architecture 204 with wordline driver logic (Wdx) and header logic (Hdr) that use buried power rails (BPR). In some implementations, the memory architecture 204 may be arranged and configured for power-gating the wordline driver logic (Wdx) with the header logic (Hdr) with the buried power rails (BPR).

In various implementations, the memory architecture 204 may be implemented as a system or a device having integrated circuit (IC) components that are arranged and coupled together as an assemblage or combination of parts that provide for physical circuit designs and related structures. In some instances, a method of designing, providing and building the memory architecture 204 as an integrated system or device may involve use of various IC circuit components described herein so as to implement the backside power distribution schemes and techniques associated therewith. The memory architecture 204 may be integrated with computing circuitry and related components on a single chip, and the memory architecture 204 may also be implemented in some embedded systems for automotive, electronic, mobile, server and Internet-of-things (IoT) applications.

As shown in FIG. 2, the memory architecture 204 includes core array circuitry 208 with bitcells arranged in columns and rows, and the memory architecture 204 includes row decoder circuitry 214 (ROWDEC) having wordline driver logic (Wdx) and powergate header logic (PG_Hdr) that are coupled to the core array 208. In various implementations, the wordline driver logic (Wdx) may be coupled to each row of bitcells (Row_BC), and the powergate logic (PG_Hdr) may be coupled to power supply connections of the wordline driver logic (Wdx) by way of backside power rails (e.g., BS/BM0, BS/BM1).

In various implementations, the memory architecture 204 may include header control logic 218 that is coupled to the powergate logic (PG_Hdr) via the backside power rails (e.g., BS/BM0, BS/BM1). The header control logic 218 may be referred to as input-output (IO) control logic, wherein the IO control logic may be configured to operate and control the powergate logic (PG_Hdr) so as to power-gate the wordline driver logic (Wdx), e.g., by activating and/or deactivating the wordline driver logic (Wdx) with the powergate logic (PG_Hdr). In some instances, the backside power rails (BS/BM0, BS/BM1) may be coupled to a first net (VDDCE) that provides a first core voltage (VDDCE) to the powergate logic (PG_Hdr), and the first core voltage (VDDCE) may refer to the external core voltage (VDDCE). Also, in some instances, the backside power rails (BS/BM0, BS/BM1) may be coupled to a second net (VDDC) that provides a second core voltage (VDDC) between the powergate logic (PG_Hdr) and the wordline driver logic (Wdx), and the second core voltage (VDDC) may refer to the internal core voltage (VDDC). Also, in some instances, the memory architecture 204 may include transition vias that are used as inter-layer via connections between multiple different metal layers (e.g., BS/BM0, BS/BM1).

In some implementations, the powergate logic (PG_Hdr) may have a transistor coupled between the first net (VDDCE) and the second net (VDDC), and the transistor is used to power-gate the wordline driver logic (Wdx). The transistor may be configured to receive the first core voltage (VDDCE) from the first net (VDDCE), and also, the transistor may provide the second core voltage (VDDC) from the second net (VDDC) to the wordline driver logic (Wdx) when activated by a control signal (e.g., CNTL). In some instances, the backside power rails (BS/BM0, BS/BM1) may be formed with buried metal layers that are used to provide the external core voltage (VDDCE) to the powergate logic (PG_Hdr), and also, the buried metal layers may be used to provide the internal core voltage (VDDC) between the powergate logic (PG_Hdr) and the wordline driver logic (Wdx).

In some implementations, as shown in FIG. 2, the row decoder circuitry 214 (ROWDEC) may have a number (N) of row decoders (e.g., ROWDEC 214A, 214B, 214C, 214D, 214E, . . . , 214N) that are coupled to a number (N) of corresponding rows of bitcells (e.g., Row_BC_0, Row_BC_1, Row_BC_2, Row_BC_, 3, Row_BC_4, . . . , Row_BC_N) in the core array 208. Also, the row decoder circuitry 214 (ROWDEC) may have a number (N) of powergate header logic control circuits (e.g., PG_Hdr_0, PG_Hdr_1, PG_Hdr_2, PG_Hdr_3, PG_Hdr_4, . . . , PG_Hdr_N) that correspond to the row decoders (ROWDEC 214A, 214B, 214C, 214D, 214E, . . . , 214N).

Also, in some implementations, the row decoder circuitry 214 (ROWDEC) may have a number (N) of wordline driver logic circuits (e.g., Wdx_0, Wdx_1, Wdx_2, Wdx_3, Wdx_4, . . . , Wdx_N) that correspond to each of the powergate headers (e.g., PG_Hdr_0, PG_Hdr_1, PG_Hdr_2, PG_Hdr_3, PG_Hdr_4, . . . , PG_Hdr_N). In some instances, as shown in FIG. 2, the header control logic 218 may be coupled to each of the powergate headers (e.g., PG_Hdr_0, PG_Hdr_1, . . . , PG_Hdr_N) via a first backside buried power rail (e.g., BS/BM0) that supplies the first core voltage (VDDCE). Moreover, each of the powergate headers (e.g., PG_Hdr_0, PG_Hdr_1, . . . , PG_Hdr_N) may be coupled to each of the wordline drivers (e.g., Wdx_0, Wdx_1, . . . , Wdx_N) via a second backside buried power rail (BS/BM1) and the first backside buried power rail (e.g., BS/BM0) that supply the second core voltage (VDDC). Also, the backside power rails (BS/BM0, BS/BM1) may be coupled together with buried transition vias.

Figure 3:
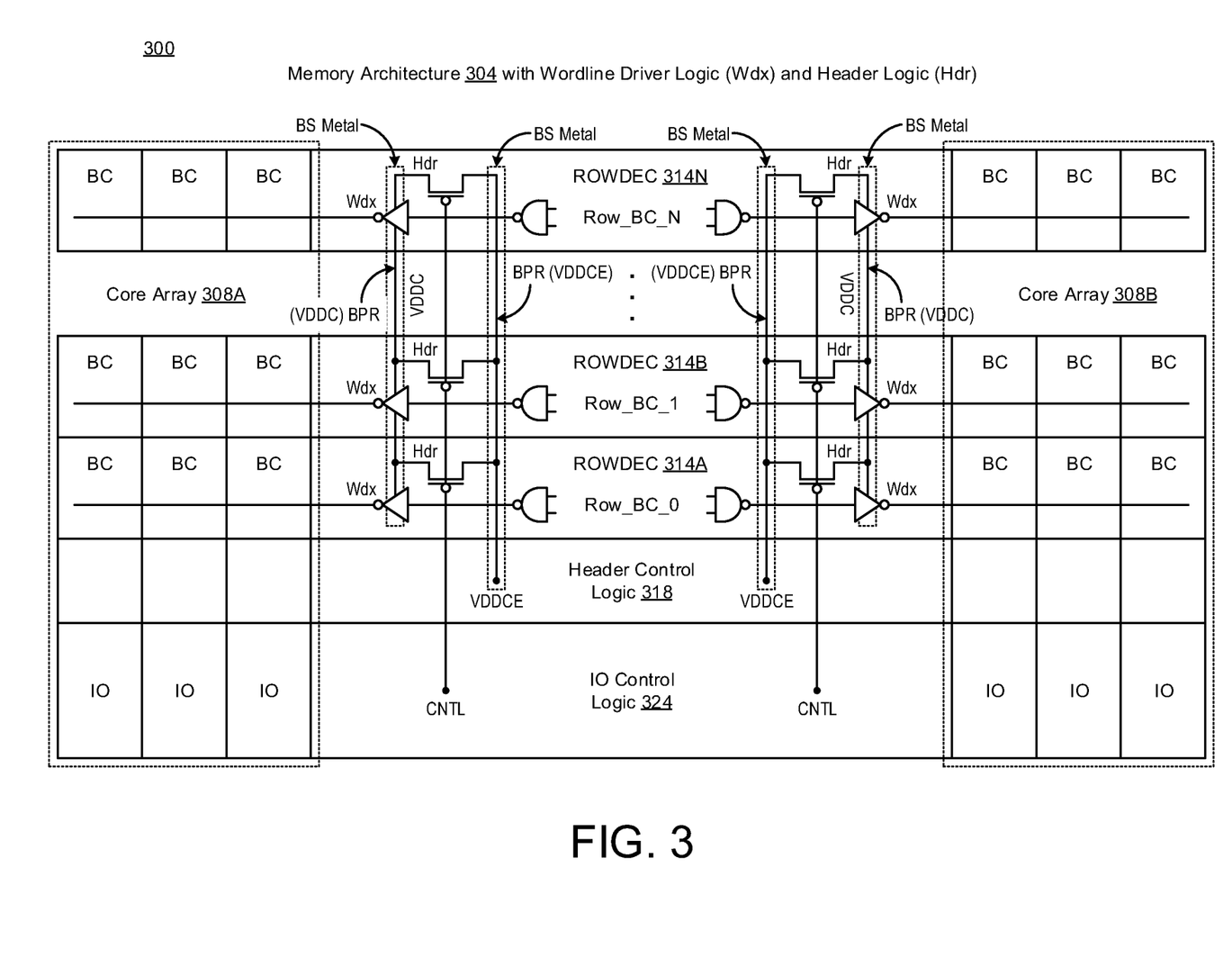

FIG. 3 illustrate a diagram of memory architecture 304 having wordline driver logic (Wdx) and header logic (Hdr) that utilize buried power rails (BPR) in accordance with various implementations described herein. In some implementations, FIG. 3 provides a configuration diagram 300 of memory architecture 304 with wordline driver logic (Wdx) and header logic (Hdr) that use buried power rails (BPR). In some implementations, the memory architecture 304 may be arranged and configured for power-gating the wordline driver logic (Wdx) with the header logic (Hdr) with the buried power rails (BPR).

In various implementations, the memory architecture 304 may be implemented as a system or a device having integrated circuit (IC) components that are arranged and coupled together as an assemblage or combination of parts that provide for physical circuit designs and related structures. In some instances, a method of designing, providing and building the memory architecture 304 as an integrated system or device may involve use of various IC circuit components described herein so as to implement the backside power distribution schemes and techniques associated therewith. The memory architecture 304 may be integrated with computing circuitry and related components on a single chip, and the memory architecture 304 may also be implemented in some embedded systems for automotive, electronic, mobile, server and Internet-of-things (IoT) applications.

As shown in FIG. 3, the memory architecture 304 includes core array circuitry 308A, 308B with bitcells (BC) arranged in columns and rows, and the memory architecture 304 includes row decoder circuitry 314 (ROWDEC) having wordline driver logic (Wdx) and powergate header logic (Hdr) coupled to the core arrays 308A, 308B. The wordline driver logic (Wdx) may be coupled to each row of bitcells (Row_BC), and the powergate logic (Hdr) may be coupled to power supply connections of the wordline driver logic (Wdx) by way of backside power rails (e.g., BPR formed with BS Metal).

The memory architecture 304 may have header control logic 318 that is coupled to the powergate logic (Hdr) via the backside power rails (BPR). Also, the header control logic 318 may be coupled to input-output (10) control logic 324, and the 10 control logic 324 may be configured to operate and control the powergate logic (Hdr) so as to power-gate the wordline driver logic (Wdx) by activating and deactivating the wordline driver logic (Wdx) with the powergate logic (Hdr). The backside power rails (BPR) may be coupled to a first net (VDDCE) that provides the first core voltage (VDDCE) to the powergate logic (Hdr), and the first core voltage (VDDCE) may refer to the external core voltage (VDDCE). The backside power rails (BPR) may be coupled to the second net (VDDC) that provides the second core voltage (VDDC) from the powergate logic (Hdr) to the wordline driver logic (Wdx), and the second core voltage (VDDC) may refer to the internal core voltage (VDDC). Also, the memory architecture 304 may have transition vias that are used as inter-layer via connections between multiple different metal layers (e.g., BPR).

In various implementations, the powergate logic (Hdr) may include transistors coupled between the first net (VDDCE) and the second net (VDDC), and the transistors are used to power-gate the wordline driver logic (Wdx). The transistors may be configured to receive the first core voltage (VDDCE) from the first net (VDDCE), and the transistors may provide the second core voltage (VDDC) from the second net (VDDC) to the wordline driver logic (Wdx) when activated by one or more control signals (e.g., CNTL). In some instances, the backside power rails (BPR) may be formed with buried metal layers that are used to provide the external core voltage (VDDCE) to the powergate logic (Hdr), and also, the buried metal layers may be used to provide the internal core voltage (VDDC) between the powergate logic (Hdr) and the wordline driver logic (Wdx).

In some implementations, as shown in FIG. 3, the row decoder circuitry 314 (ROWDEC) may have a number (N) of row decoders (ROWDEC 314A, 314B, . . . , 314N) coupled to a number (N) of corresponding rows of bitcells (Row_BC_0, Row_BC_1, . . . , Row_BC_N) in the core arrays 308A, 308B. The row decoder circuitry 314 (ROWDEC) may have a number (N) of powergate headers (Hdr) that correspond to the row decoders (ROWDEC 314A, 314B, . . . , 314N). The powergate headers (Hdr) may be implemented with a P-type MOS (PMOS) transistor; however, other devices may be used.

Also, in some implementations, the row decoder circuitry 314 (ROWDEC) may have a number (N) of wordline drivers (Wdx_0, Wdx_1, . . . , Wdx_N) that correspond to the powergate headers (Hdr). In some instances, the wordline drivers may include various logic, such as, e.g., an inverter, a NAND gate, or similar. As shown in FIG. 3, the header control logic 318 may be coupled to the powergate headers (Hdr) via at least one backside buried power rail (BPR) that supplies the first core voltage (VDDCE). Also, the powergate headers (Hdr) are coupled to the wordline drivers (Wdx) via at least one other backside buried power rail (BPR) that supplies the second core voltage (VDDC). Also, the backside power rails (BPR) may be coupled together with buried transition vias.

Figure 4:
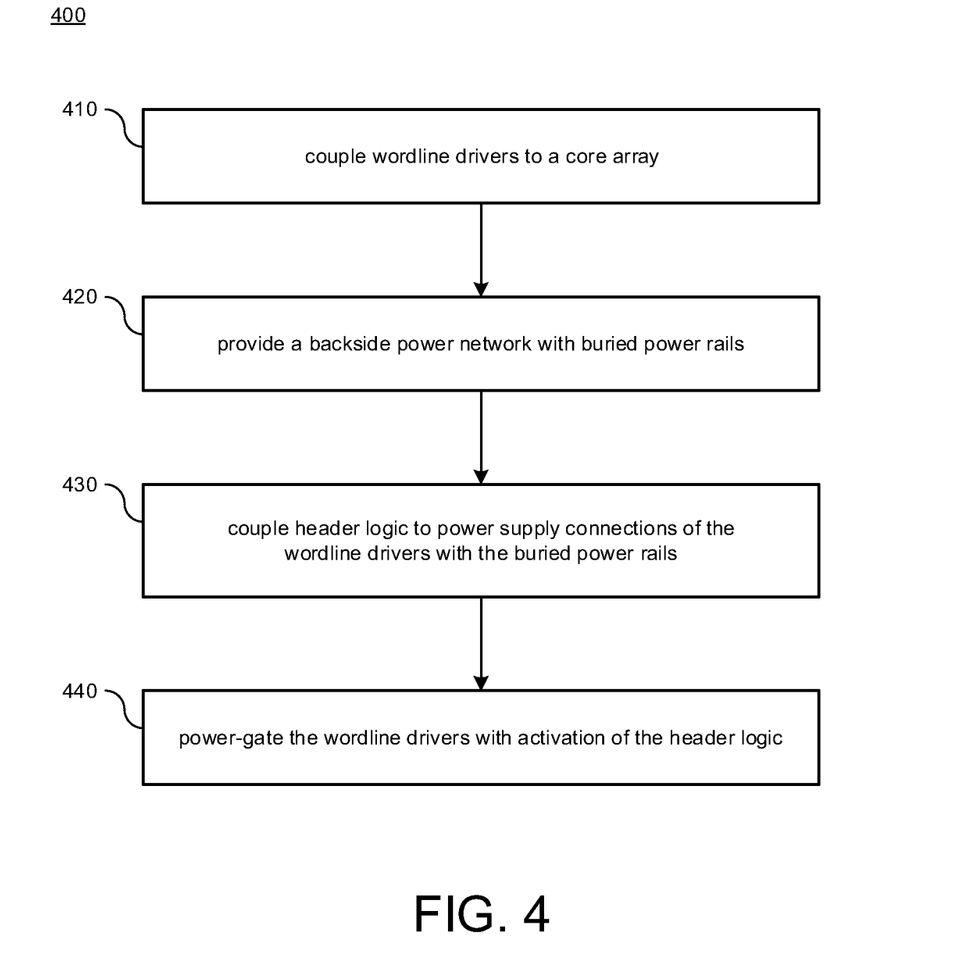
FIG. 4 illustrates a diagram of a method for power-gating wordline drivers with buried power rails in accordance with various implementations described herein.

FIG. 4 illustrates a diagram of a method 400 for powergating wordline drivers with buried power rails in accordance with implementations described herein. In various implementations, method 400 may be configured for powergating memory related logic, such as, e.g., wordline drivers, with backside (BS) buried power rails (BPR).

It should be understood that even though the method 400 indicates a particular order of operation execution, in some cases, various particular portions of the operations may be executed in a different order, and on different systems. In other cases, additional operations and/or steps may be added to and/or omitted from method 400. Also, method 400 may be implemented in hardware and/or software. If implemented in hardware, the method 400 may be implemented with various components and/or circuitry, as described herein in reference to FIGS. 1-3. Also, if implemented in software, the method 400 may be implemented as a program and/or software instruction process configured for providing various backside power-gating schemes and techniques, as described herein. Moreover, if implemented in software, various instructions related to implementing method 400 may be stored in memory and/or a database. For instance, various types of computing devices having a processor and memory may be configured to perform method 400.

In various implementations, the method 400 may refer to a method of designing, providing, building, fabricating and/or manufacturing backside power rail architecture as an integrated system, device and/or circuit that may involve use of the various IC circuit components described herein so as to implement backside power distribution schemes and techniques associated therewith. In some implementations, the backside power rail architecture may be integrated with computing circuitry and other related components on a single chip, and the backside power distribution circuitry may be implemented in various embedded systems for automotive, electronic, mobile, server and Internet-of-things (IoT) applications, including remote sensor nodes.

At block 410, method 400 may couple wordline drivers to a core array. At block 420, method 400 may provide a backside power network (BSPN) with buried power rails (BPR). At block 430, method 400 may couple header logic to power supply connections of the wordline drivers with the buried power rails (BPR). At block 440, method 400 may power-gate the wordline drivers with activation of the header logic.

In some implementations, the buried power rails (BPR) may have a first net that provides an external core voltage (VDDCE) to the header logic, and also, the buried power rails (BPR) may have a second net that provides an internal core voltage (VDDC) from the header logic to the wordline drivers. The header logic may include a transistor that is coupled between the first net and the second net such that the transistor is used to power-gate the wordline drivers. Also, the transistor may be configured to receive the external core voltage (VDDCE) from the first net and provide the internal core voltage (VDDC) to the wordline drivers when activated by a control signal.

In some implementations, the backside power network may have buried metal layers that are used to form the buried power rails (BPR). The buried metal layers may be used to provide an external core voltage (VDDCE) to the header logic, and the buried metal layers may be used to provide an internal core voltage (VDDC) between the header logic and the wordline drivers.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device with wordline drivers coupled to a core array. The device may have backside power network with buried power rails.

The device may include header logic that is coupled to power supply connections of the wordline drivers by way of the buried power rails, and the header logic may be used to power-gate the wordline drivers.

Described herein are various implementations of a device having core array circuitry with bitcells arranged in columns and rows. The device may include row decoder circuitry having wordline driver logic and powergate logic. The wordline driver logic may be coupled to each row of bitcells. The powergate logic may be coupled to power supply connections of the wordline driver logic by way of backside power rails.

Described herein are various implementations of a method. The method may couple wordline drivers to a core array, and the method may provide a backside power network with buried power rails. The method may couple header logic to power supply connections of the wordline drivers with the buried power rails, and also, the method may power-gate the wordline drivers with activation of the header logic.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing refers to implementations of various techniques described herein, various other and further implementations may be devised in accordance with the disclosure herein, which may be determined by the claims that follow.

Although the subject matter has been described in language that is specific to various structural features and/or methodological acts, it is to be understood that subject matter defined in the appended claims is not necessarily limited to the specific features or acts described above. Rather, specific features and acts described above are disclosed as example forms of implementing the claims.

What is claimed is:

1. A device, comprising:
   wordline drivers coupled to a core array;
   backside power network having buried power rails including a first buried power rail and a second buried power rail that is different than the first buried power rail; and
   header logic coupled to power supply connections of the wordline drivers by way of the buried power rails, wherein the first buried power rail provides a first core voltage to an input of the header logic, wherein the second buried power rail is coupled between an output of the header logic and the power supply connections of the wordline drivers to provide a second core voltage to the wordline drivers, and wherein the header logic is used to power-gate the wordline drivers.

2. The device of claim 1, wherein the wordline drivers have inverter logic that is activated with a first wordline signal, and wherein the wordline drivers provide a second wordline signal to the core array when activated.

3. The device of claim 1, wherein the buried power rails include the first buried power rail that is coupled to a first net that provides the first core voltage to the input of the header logic.

4. The device of claim 3, wherein the first net provides the first core voltage as an external core voltage (VDDCE).

5. The device of claim 3, wherein the buried power rails include the second buried power rail that is coupled to a second net that provides the second core voltage from the output of the header logic to the power supply connections of the wordline drivers.

6. The device of claim 5, wherein the second net provides the second core voltage as an internal core voltage (VDDC).

7. The device of claim 5, wherein the header logic includes a transistor coupled between the first net and the second net, and wherein the transistor is used to power-gate the wordline drivers.

8. The device of claim 7, wherein the transistor receives the first core voltage from the first net, and wherein the transistor provides the second core voltage from the second net to the wordline drivers when activated by a control signal.

9. The device of claim 1, wherein the backside power network includes buried backside metal layers that are used to form the buried power rails.

10. The device of claim 9, wherein the buried backside metal layers are used to provide an external core voltage (VDDCE) to the header logic, and wherein the buried backside metal layers are also used to provide an internal core voltage (VDDC) between the header logic and the wordline drivers.

11. A device, comprising:
core array circuitry with bitcells arranged in columns and rows; and
row decoder circuitry having wordline driver logic and powergate logic,
wherein the wordline driver logic is coupled to each row of bitcells,
wherein inputs of the powergate logic are coupled to first backside power rails that provide a first core voltage to the powergate logic, and
wherein outputs of the powergate logic are coupled to power supply connections of the wordline driver logic by way of second backside power rails that provide a second core voltage from the powergate logic to the wordline driver logic.

12. The device of claim 11, further comprising:
input-output (IO) control logic coupled to the powergate logic,
wherein the IO control logic is configured to operate and control the powergate logic so as to power-gate the wordline driver logic by activating and deactivating the wordline driver logic with the powergate logic.

13. The device of claim 11, wherein the first backside power rails are coupled to a first net that provides the first core voltage to the powergate logic, and wherein the first core voltage refers to an external core voltage (VDDCE).

14. The device of claim 13, wherein the second backside power rails are coupled to a second net that provides the second core voltage from the powergate logic to the wordline driver logic, and wherein the second core voltage refers to an internal core voltage (VDDC).

15. The device of claim 14, wherein the powergate logic has a transistor coupled between the first net and the second net, and wherein the transistor is used to power-gate the wordline driver logic.

16. The device of claim 15, wherein the transistor receives the first core voltage from the first net, and wherein the transistor provides the second core voltage from the second net to the wordline driver logic when activated by a control signal.

17. The device of claim 11, wherein the backside power rails are formed with buried metal layers, wherein the buried metal layers are used to provide an external core voltage (VDDCE) to the powergate logic, and wherein the buried metal layers are used to provide an internal core voltage (VDDC) between the powergate logic and the wordline driver logic.

18. A method, comprising:
coupling wordline drivers to a core array;
providing a backside power network with buried power rails including a first buried power rail and a second buried power rail;
coupling header logic to power supply connections of the wordline drivers with the buried power rails, wherein the first buried power rail provides a first core voltage to an input of the header logic, wherein the second buried power rail is coupled between an output of the header logic and the power supply connections of the wordline drivers to provide a second core voltage to the wordline drivers; and
power-gating the wordline drivers with activation of the header logic.

19. The method of claim 18, wherein:
the first buried power rail is coupled to a first net that provides the first core voltage as an external core voltage (VDDCE) to the header logic,
the second buried power rail is coupled to a second net that provides the second core voltage as an internal core voltage (VDDC) from the header logic to the wordline drivers,
the header logic has a transistor that is coupled between the first net and the second net such that the transistor is used to power-gate the wordline drivers, and
the transistor is configured to receive the external core voltage (VDDCE) from the first net and provide the internal core voltage (VDDC) to the wordline drivers by way of the second net when activated by a control signal.

20. The method of claim 18, wherein:
the backside power network has buried metal layers that are used to form the buried power rails,
the buried metal layers are used to provide an external core voltage (VDDCE) to the header logic, and
the buried metal layers are used to provide an internal core voltage (VDDC) between the header logic and the wordline drivers.

\* \* \* \* \*